(12) United States Patent
Yasunaga et al.

(10) Patent No.: US 6,756,660 B2
(45) Date of Patent: Jun. 29, 2004

(54) LEAD FRAME FOR A SEMICONDUCTOR DEVICE AND A SEMICONDUCTOR DEVICE INCORPORATING THE LEAD FRAME

(75) Inventors: Shoshi Yasunaga, Fukuoka (JP); Takahiro Ishibashi, Fukuoka (JP); Hiroaki Narimatsu, Fukuoka (JP)

(73) Assignee: Mitsui High-tec, Inc. (JP)

( * ) Notice: Subject to any disclaimer, the term of this patent is extended or adjusted under 35 U.S.C. 154(b) by 0 days.

(21) Appl. No.: 10/322,900

(22) Filed: Dec. 18, 2002

(65) Prior Publication Data

US 2003/0155634 A1 Aug. 21, 2003

(30) Foreign Application Priority Data

Dec. 19, 2001 (JP) ........................... P. 2001-386338

(51) Int. Cl.[7] ............................................ H01L 23/495
(52) U.S. Cl. ................... 257/666; 257/666; 257/667
(58) Field of Search ............................ 257/666, 667, 257/684, 730, 670, 674, 709, 787

(56) References Cited

U.S. PATENT DOCUMENTS 5,202,577 A * 4/1993 Ichigi et al. ............... 257/667
6,525,406 B1 * 2/2003 Chung et al. ............... 257/666

* cited by examiner

*Primary Examiner*—David Nelms
*Assistant Examiner*—Thinh T Nguyen
(74) *Attorney, Agent, or Firm*—Wood, Phillips, Katz, Clark & Mortimer

(57) ABSTRACT

A lead frame for a semiconductor device. The lead frame has opposite first and second sides bounded respectively by first and second parallel reference planes between which a thickness is defined. The lead frame has a support with a surface at the first side of the lead frame for receiving a semiconductor chip. A plurality of leads are spaced from the support to be electrically connected to a semiconductor chip on the support. A first lead in the plurality of leads has a length between first and second ends and a width taken transversely to the length. The first end of the first lead has a first region that has a thickness less than the thickness of the first lead at the second end of the first lead so that at least a part of the first region is offset from the second reference plane toward the first reference plane. The first end of the first lead has at least a first protrusion projecting away from the first reference plane.

30 Claims, 5 Drawing Sheets

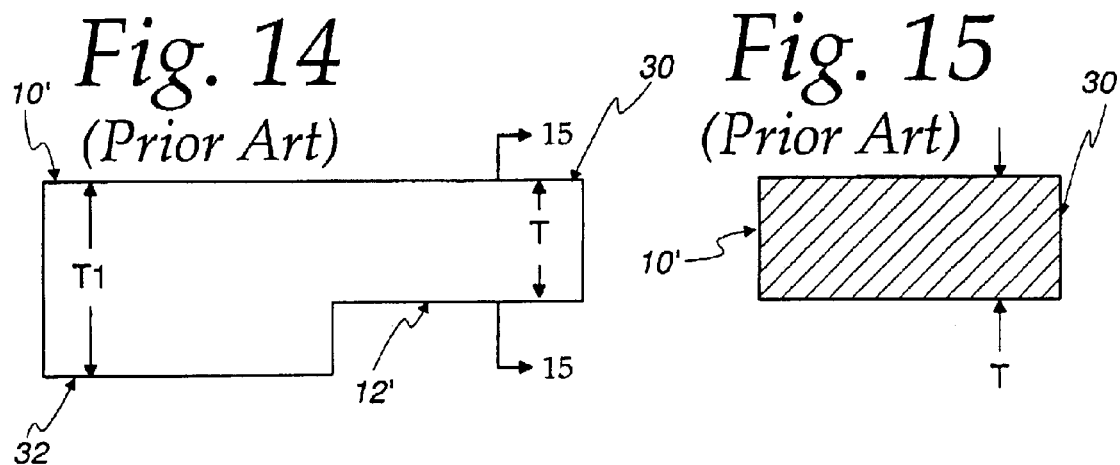
Fig. 14 (Prior Art)
Fig. 15 (Prior Art)
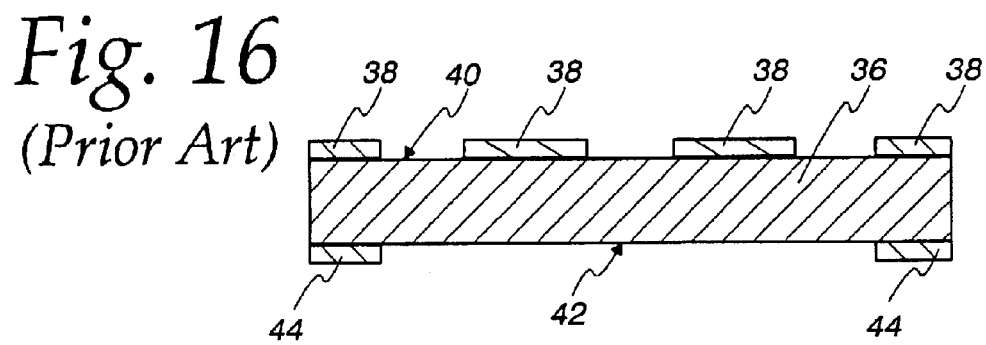
Fig. 16 (Prior Art)
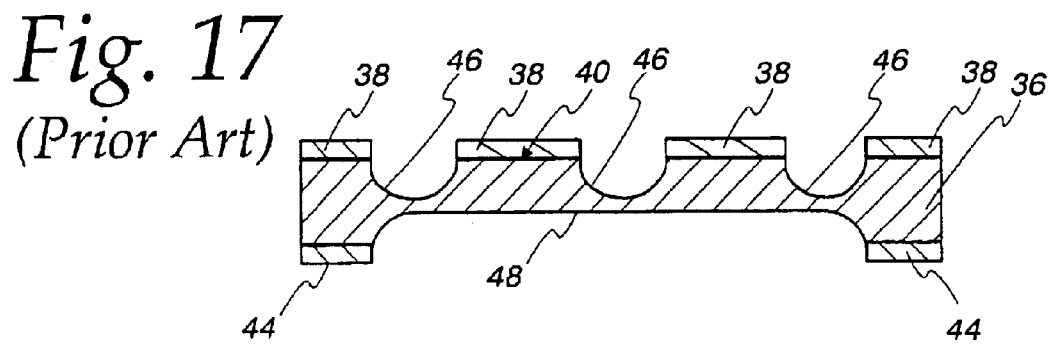
Fig. 17 (Prior Art)
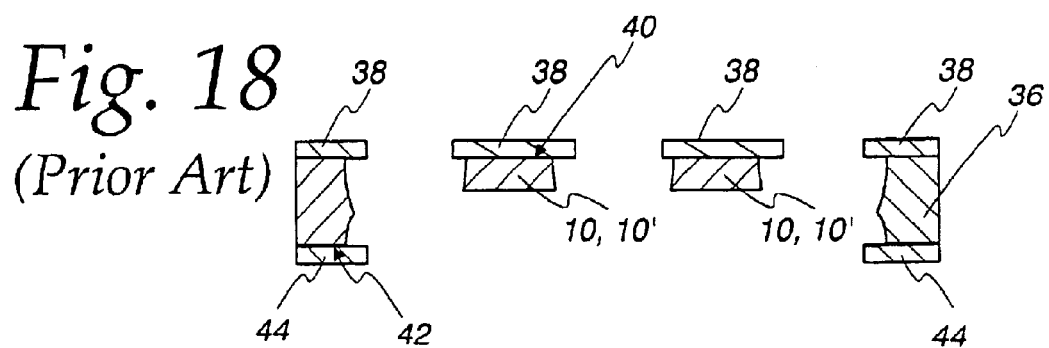
Fig. 18 (Prior Art)

US 6,756,660 B2

LEAD FRAME FOR A SEMICONDUCTOR DEVICE AND A SEMICONDUCTOR DEVICE INCORPORATING THE LEAD FRAME

BACKGROUND OF THE INVENTION

1. Field of the Invention

This invention relates to lead frames for semiconductor devices and to a semiconductor device incorporating such a lead frame.

2. Background Art

There has been a trend in recent years to minimize the size of semiconductor devices. This makes possible the compact and lightweight construction of electronic appliances, and the like, incorporating the semiconductor devices. As examples of appliances, for which size and weight are key design considerations, are portable telephones, PDA devices, as well as myriad other portable electronic appliances used in many diverse environments and for different purposes. Various designs of semiconductor devices have evolved over the years to achieve the ends of miniaturization, thickness reduction and weight reduction. These devices are commonly referred to as TBGA that use a lead frame and TAB (tape automated bonding) tape, BGA (Ball Grid Array), and CSP (chip size package) that use flexible printed circuit boards. Options include wafer-scale CSP, which is the same size as the chip, and CSP, which is somewhat larger than the chip.

Of these devices, particular interest has been paid to semiconductor devices of the type wherein leads are exposed at a flat face within the confines of a resin sealed package, rather than on the edges thereof. Exemplary packages are those referred to as SON (small outline non-leaded package) and QFN (quad flat non-leaded package). Conventional lead frames of this type are shown in FIGS. 11–18 herein.

More specifically, as shown in FIGS. 11 and 12, it is known to form a generally rectangular lead 10 and, through a half-etching process, form an undercut 12 through one surface 14 thereof. The undercut 12 defines a receptacle 16 for an encapsulating, sealing material, which is molded around the lead 10 in a manner so as to leave the surface 14 exposed through the sealing material. By causing the sealing material to migrate into the receptacle 16, the tendency of the lead 10 to separate from the encapsulating, sealing material is diminished.

While the undercut 12 facilitates bonding of the encapsulating material to the lead 10, the undercut 12 also weakens the lead 10 so as to cause a condition shown in FIG. 12, resulting from the electrical connection of a conductive element/wire 17 to the lead 10. Under the force induced by a tool 18 used in electrically connecting the conductive element/wire 17 to the lead 10, the thinned lead end 19 may bend at a line 20 coinciding with the edge of the undercut 12 so that the requisite pressure to establish the connection cannot be applied. This may cause load problems and degradation of ultrasound transfer efficiency. The inherent flexibility of the thinned lead end 19 may make stabilization of the lead end 19 during processing difficult or impossible.

To overcome this problem, it is known to stabilize the thinned lead end 19 during the electrical connection process. As seen in FIG. 13, a heat block 22 bears on one side 23 of a lead frame sheet 24 from which the lead 10 and a support 25, upon which a semiconductor chip 26 is mounted, are formed. To avoid the deformation as shown in FIG. 12, the heat block 22 is provided with an adapter 27 which nests supportingly under the lead undercut 12.

The use of the adapters has drawbacks. First of all, modifying the heat blocks may have to be done in many different manners to accommodate different configurations of leads. Thus, it may not be possible to develop a universal heat block form.

Additionally, with batch mold type lead frames (MAP: Mold Array Package), it may not be possible to place adapters on the heat blocks. As a result, there may be defects in the bonding of the conductive elements/wires to the leads. This problem may be further aggravated by the application of a tape conventionally used to prevent leakage of the sealing resin material during the molding process.

In FIGS. 14 and 15, a lead 10', similar to the lead 10 in FIGS. 11 and 12, is shown with an undercut 12', produced by a half-etching process, so as to reduce the thickness T of the lead end 30 from the starting thickness T1 at the opposite lead end 32.

In FIGS. 16–18, a conventional half-etching process is depicted to sequentially form undercut/thinned leads 10, 10' from a starting lead frame sheet 36. Resist elements 38 are strategically placed on one side 40 of the lead frame sheet 36 to shield the region over which the leads 10, 10' are to be formed. The opposite side 42 of the lead frame sheet 36 has strategically located resist elements 44 placed thereon so as to leave the region of the lead frame sheet 36 underlying the resist elements 38 exposed. With the lead frame sheet 36 and resist elements 38, 44 in the FIG. 16 relationship, etching is undertaken so as to progressively wear away the lead frame sheet 36, thereby to form grooves 46 at the one side 40 of the lead frame sheet 36 between the resist elements 38, and a single groove 48 on the opposite side 42 of the lead frame sheet 36 between the resist elements 44. Etching continues from the FIG. 17 state until the grooves 46, 48 become contiguous, thereby producing the leads 10, 10', which may have the same, or similar, construction to the formed leads 10, 10', in FIGS. 11, 12 and 14, 15, respectively.

SUMMARY OF THE INVENTION

In one form, the invention is directed to a lead frame for a semiconductor device. The lead frame has opposite first and second sides bounded respectively by first and second parallel reference planes between which a thickness is defined. The lead frame has a support with a surface at the first side of the lead frame for receiving a semiconductor chip. A plurality of leads are spaced from the support to be electrically connected to a semiconductor chip on the support. A first lead in the plurality of leads has a length between first and second ends and a width taken transversely to the length. The first end of the first lead has a first region that has a thickness less than the thickness of the first lead at the second end of the first lead so that at least a part of the first region is offset from the second reference plane toward the first reference plane. The first end of the first lead has at least a first protrusion projecting away from the first reference plane.

In one form, the protrusion has a width less than the width of the first lead and the first end of the first lead is closer to the support than is the second lead end.

The protrusion may project towards but not fully to the second reference plane.

In one form, the protrusion tapers to an apex.

The apex may be substantially a point with the first lead viewed in cross section taken transversely to the length of the first lead.

In one form, the first lead has spaced first and second edges between which the width of the first lead is defined and the protrusion is substantially centered between the first and second edges.

In one form, the protrusion has a lengthwise extent along the length of the first lead over substantially the entire first region.

The protrusion may be centered between the first and second edges over the entire lengthwise extent of the protrusion.

In one form, the protrusion tapers to a linear apex.

The first lead may have a second protrusion projecting away from the first reference plane at a location spaced lengthwise of the first lead from the first protrusion.

The second protrusion may have a width less than the first lead.

The second protrusion may taper to an apex.

The region of the first lead may be formed by an etching process.

The invention contemplates the above lead frame in combination with a semiconductor chip mounted on the surface of the support.

The invention further contemplates a semiconductor device, consisting of the above-described lead frame with a semiconductor mounted to the support surface, a conductive element electrically connecting the semiconductor chip to the first lead, and a sealing material. The sealing material covers the semiconductor chip and is applied to a surface of the first lead between first and second ends of the first lead between the first and second reference planes at the first region of the first lead so that the second end of the first lead is exposed.

The first protrusion may be fully covered by the sealing material between the first and second ends of the first lead.

In one form, the conductive element connects to the first lead closer to the first end of the first lead than to the second end of the first lead.

BRIEF DESCRIPTION OF THE DRAWINGS

FIG. 3 is an enlarged, fragmentary, perspective view of a lead on a tie bar portion of the lead frame in FIG. 1;

FIG. 4 is a fragmentary, side elevation view of the lead in FIG. 3 in conjunction with other elements on the semiconductor device in FIG. 2 shown in schematic form;

FIG. 5 is a cross-sectional view of the lead taken along line 5—5 of FIG. 4;

FIGS. 6–8 show the sequential formation of the lead frame/lead of FIGS. 1–5 using a half-etching process wherein: FIG. 6 is a cross-sectional view of a portion of the lead frame of FIG. 1 with resist layers on opposite sides thereof preparatory to half-etching processing thereof; FIG. 7 is a view as in FIG. 6 and showing the partial formation of the lead frame through the half-etching process; and FIG. 8 is a view as in FIGS. 6 and 7 with the lead frame formation completed;

FIG. 14 is a side elevation view of another conventional lead, similar to that in FIGS. 11 and 12;

FIG. 15 is a cross-sectional view of the lead taken along line 15—15 of FIG. 14; and FIGS. 16–18 show sequentially a process for forming leads in a conventional process with three stages corresponding to those in FIGS. 6–8.

DETAILED DESCRIPTION OF THE DRAWINGS

Figure 1:
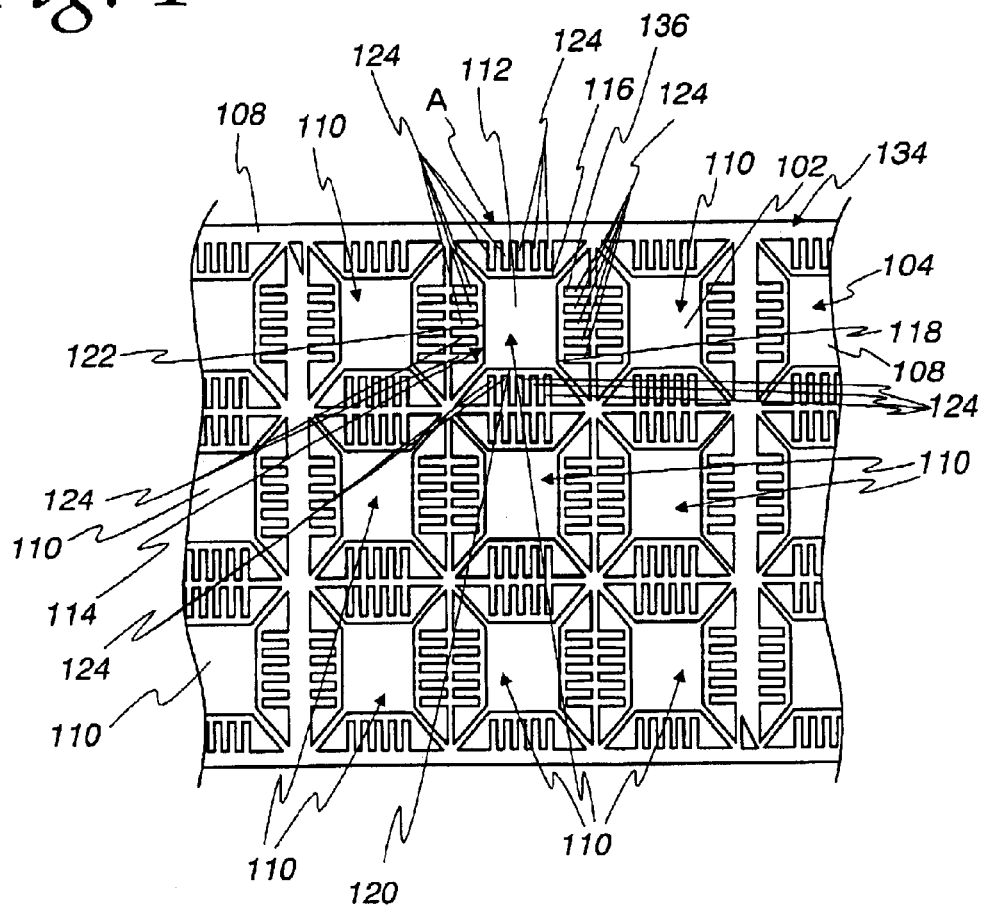
FIG. 1 is a fragmentary, plan view of a lead frame made according to the present invention.
Figure 2:
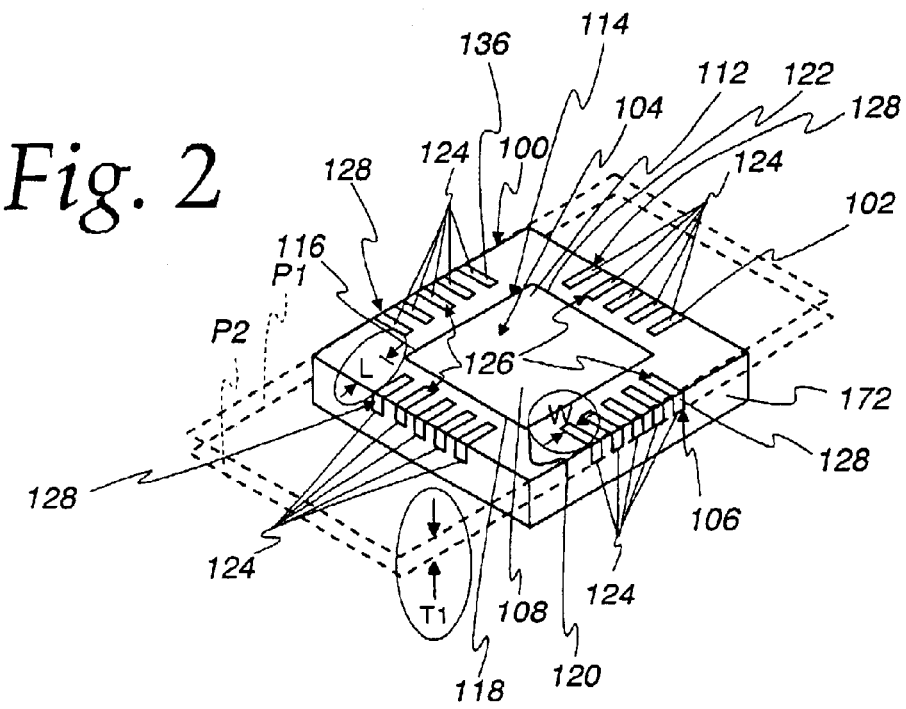
FIG. 2 is a perspective view of a semiconductor device incorporating a unit portion of the lead frame in FIG. 1.

Referring initially to FIGS. 1 and 2, a semiconductor device is shown at 100, incorporating a portion of a lead frame 102. The lead frame 102 has oppositely facing sides 104, 106 bounded by first and second parallel reference planes P1, P2, between which a thickness T1 is defined.

The lead frame 102 is a MAP-type configuration formed by etching a copper or iron-nickel sheet 108 and may have a thickness T1 on the order of 0.2 millimeters. The lead frame 102 consists of a matrix of unit lead frames 110. Exemplary unit lead frame 110 at A consists of a support 112 having a polygonal shape with a square peripheral edge 114. The edge 114 is defined by four orthogonal edge portions 116, 118, 120, 122. A plurality of leads (in this case five) 124 are provided at each edge portion 116–122 in spaced relationship therewith.

Figures 3, 4, 5:
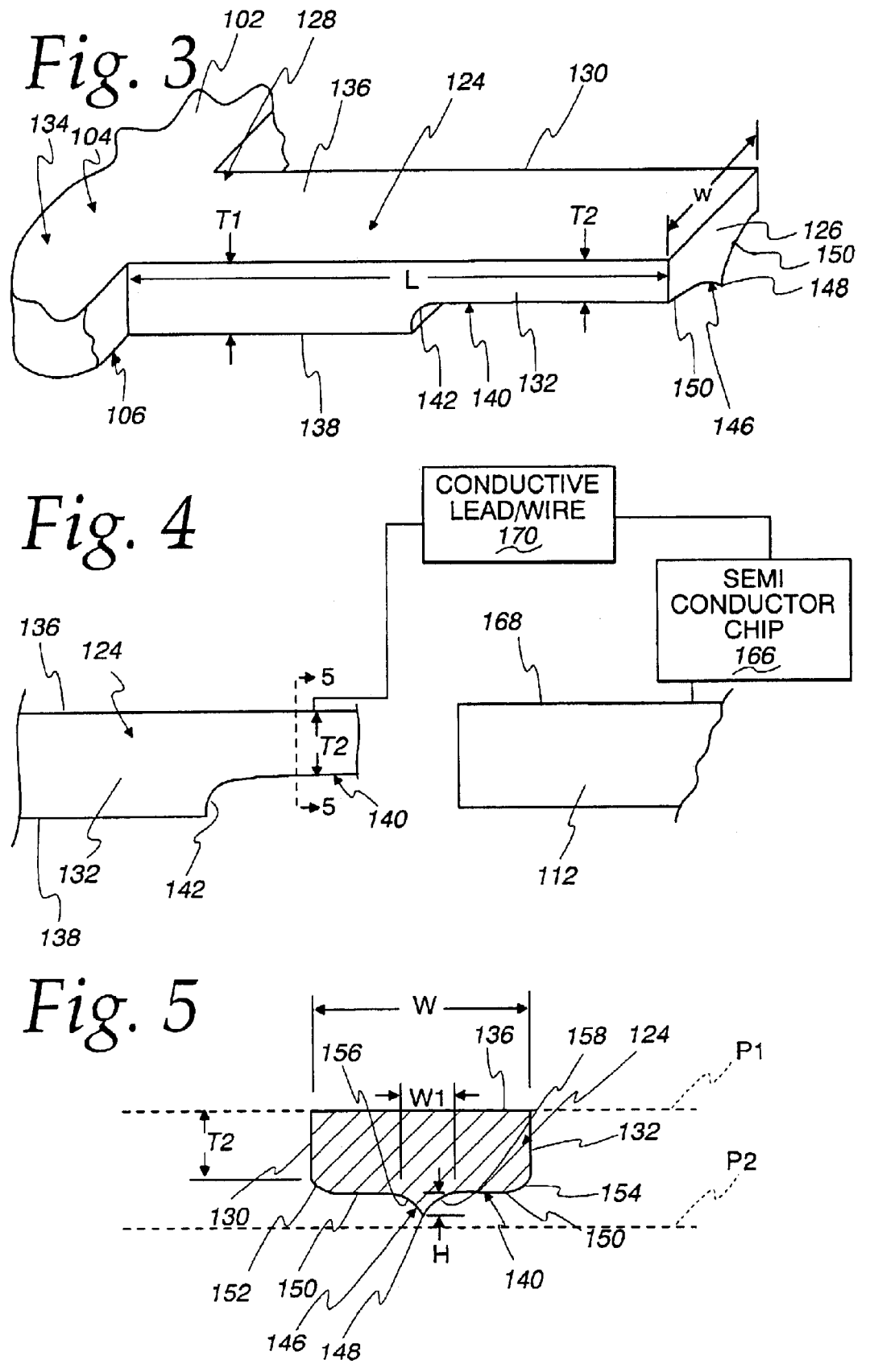

The leads 124, seen also in FIGS. 3–5 in conjunction with FIGS. 1 and 2, have a length L between spaced ends 126, 128, a width W between side edges 130, 132, and a thickness T1 at the end 128. The end 128 is integral with a tie bar network 134 which interconnects and maintains the leads 124 and supports 112 in operative relationship. The tie bar network 134 also maintains the unit lead frames 110 in the matrix arrangement shown in FIG. 1.

In an exemplary embodiment, the leads 124 have a length (L) on the order of 0.8 millimeters. The surface 136 of the lead 124 on the lead frame side 104 is substantially planar. The lead 124 on the opposite side 106 of the lead frame 102 has a flat surface 138, at the lead end 128 and facing oppositely to the surface 136, and an undercut/formed region 140 joined by a curved transition edge 142 to the surface 138. The undercut/formed region 140 has a thickness T2 at the lead end 126 that is reduced from the thickness T1. In one form, the thickness T1 extends over approximately one-half of the length L of the lead 124, with the thickness T2 extending over the other half of the length L. The thickness T1, as noted above, may be on the order of 0.2 millimeters, with the thickness T2 being on the order of one-half that dimension, i.e. 0.1 millimeter. For purposes of explanation herein, the reference to the end 128 will identify the lead portion with the thickness T1, whereas reference to the other end at 126 will identify the lead portion having the undercut/formed region 140.

Through a half-etching process as hereinafter described, the undercut/formed region 140 of the lead 124 at the end 126 is configured to be reduced in thickness and also so as to define a protrusion 146. The protrusion 146 terminates at a pointed, linear apex 148, which is centered between the edges 130, 132 and extends over the entire lengthwise extent of the undercut/formed region 140. A surface 150 of the undercut/formed region 140 is offset from the reference plane P2 towards the reference plane P1, with the protrusion 146 projecting from the surface 150 towards the second reference plane P2. Curved edge surfaces 152, 154 transition between the edges 130, 132 and the surface 150. The surface 150 is symmetrical on the sides of the protrusion 146, with concave surface portions 156, 158 converging at the apex 148. In one form, the degree of projection of the protrusion 146 is identified by H in FIG. 5 and is on the order of 15–30 microns. Preferably, the protrusion 146 projects towards, but not fully up to, the reference plane P2.

Figure 6:
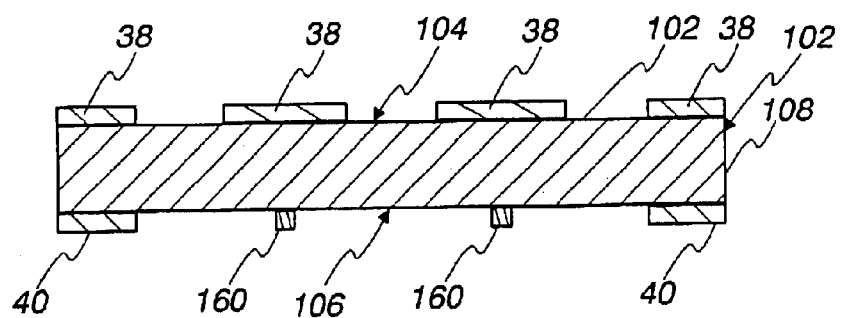
Figure 7:
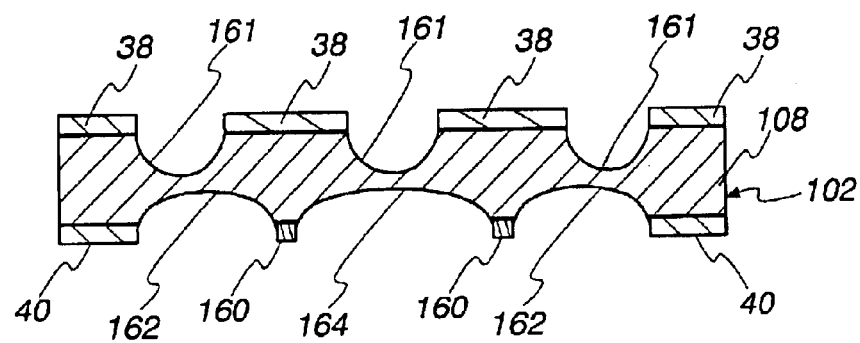
Figure 8:
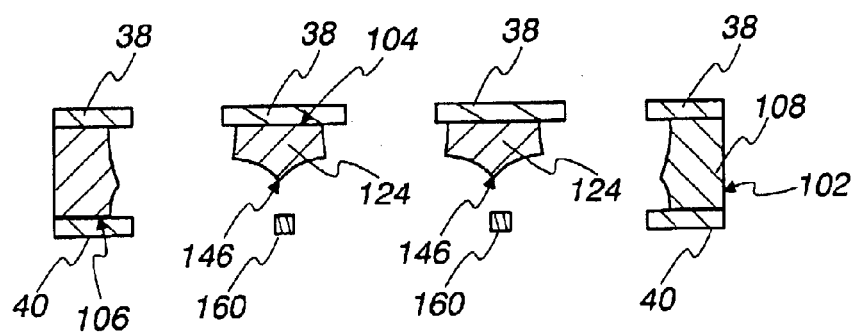

The half-etching process used to form the lead frame 102 and the leads 124 is described with respect to FIGS. 6–8, which correspond to FIGS. 16–18, previously described. The inventive process is similar in that it utilizes the resist elements 38, 40 on the opposite sides 104, 106 of the lead frame 102. However, additionally, small resist elements 160 are strategically placed on the lead frame side 106 in coincidence with the leads 124. The process is the carried out in the same manner from the FIG. 6 state, to form grooves 161 between the resist elements 38 on the one side 104 of the lead frame 102, grooves 162 between the resist elements 40, 160 on the other lead frame side 106, and a groove 164 between the resist elements 160, shown in FIG. 7. Continued processing causes the grooves 161, 162, 164 to connect, as shown in FIG. 8. The relatively small resist elements 160 shield the leads 124 at the protrusions 146 so that they are formed as shown in FIG. 8 and FIGS. 3–5.

As seen in FIG. 4, once the half-etching process is completed, a semiconductor chip 166 is mounted on a surface 168 of the support 112 and is electrically connected to the lead end 126 having the reduced thickness using conductive elements/wires 170. A sealing component, such as resin 172 (FIG. 2), is then molded so as to fully encapsulate the semiconductor chip 166, the conductive elements/wires 170, and the side edges 130, 132 of the leads 124. The resin 172 migrates into the undercut/formed region 140 so as to fully surround the entire width W1 (FIG. 5) of the protrusion 146. A substantial layer of resin 172 thus resides between the lead surface 150 and apex 148 and the reference plane P2. While preferably the entire protrusion 146 becomes covered/encapsulated by the resin 172, the invention contemplates that part of the protrusion 146 might be exposed, as at the apex 148.

The resin sealing may be accomplished with the components built upon the lead frame 102 in the FIG. 1 configuration. A continuous layer of the sealing resin 172 may be applied over the joined unit lead frames 110 with components built up thereon. The semiconductor devices 100, each with their associated unit lead frame 110, are then separated by a cutting operation, as is known in the art.

The following Table I illustrates the effectiveness of wire bonding using a lead frame 102 and leads 124 thereon, made according to the present invention, compared to conventional lead frame constructions where no half-etching of the leads is performed. No comparative testing was conducted utilizing lead frames with half-etched leads without protrusions, according to the prevent invention, because the wire bonding process was generally ineffective.

TABLE 1

|  | STD Type (no half-etching)* | Half-Etching Type (with protrusions)* |
|---|---|---|
| Max. | 15.4 | 15.9 |
| Min. | 12.3 | 11.6 |
| Avg. | 13.6 | 13.7 |
| Std. | 0.74 | 0.98 |
| Cpk | 4.31 | 3.32 |

*units in grams

It can be seen from Table I that the tenacity of the bonding of the conductive elements/wires 170 to the leads 124 was approximately the same as the bonding using a standard lead without half-etching.

Figure 9:
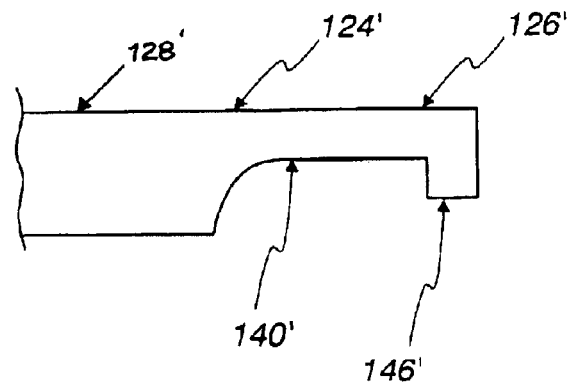
FIG. 9 is a view as in FIG. 4 of a modified form of lead, according to the present invention.

Another form of lead, according to the present invention, is shown in FIG. 9 at 124'. The lead 124' is similar to the lead 124 with the exception that the protrusion 146' is formed over only a portion of the overall length of the undercut/formed region at 140'. More specifically, the protrusion 146' is preferably provided at a location at which electrical connection with the previously described leads/wires 170 (FIG. 4) is effected. The lead 124' otherwise has the same construction as the lead 124, i.e. the shape and degree of projection of the protrusion 146'.

Figure 10:
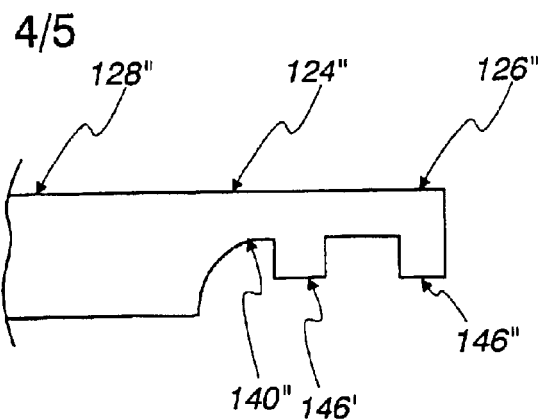
FIG. 10 is a view as in FIG. 9 of a still further modified form of lead, according to the present invention.
Figure 11:
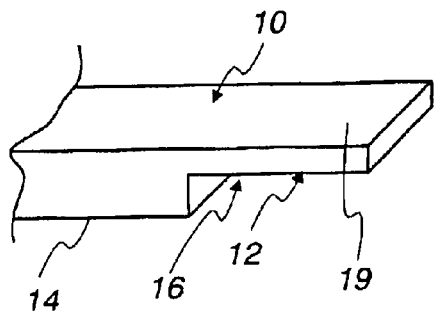
FIG. 11 is a perspective view of a conventional lead on a lead frame.
Figure 12:
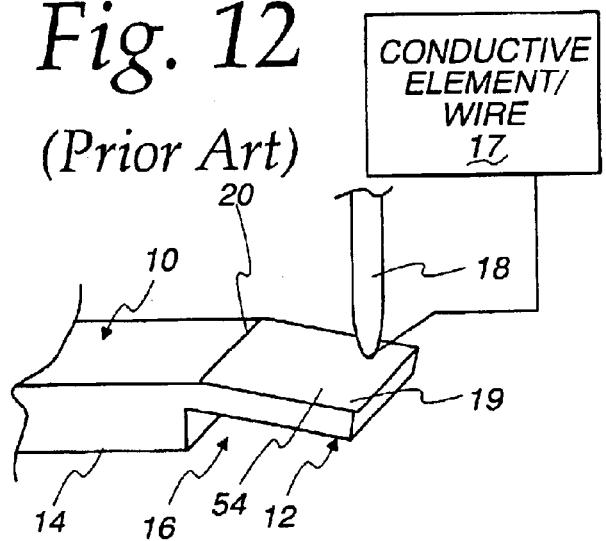
FIG. 12 is a view as in FIG. 11 with the lead deformed during the process of connecting a conductive element to the lead.
Figure 13:
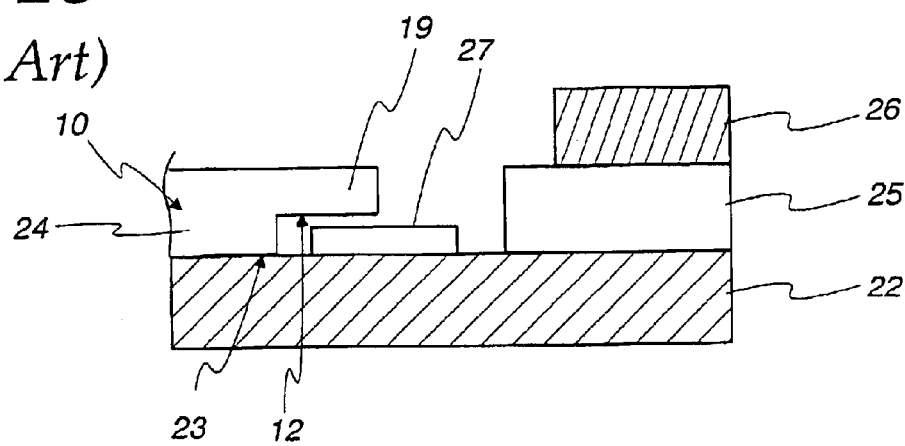
FIG. 13 is a side elevation, partial cross-sectional, view of a conventional heat block in relationship to a lead, as in FIGS. 11 and 12, with an adapter used to support the contact to avoid the condition of FIG. 12.

In FIG. 10, a third embodiment of an inventive lead is shown at 124". The lead 124" is similar to the lead 124', with the exception that a second protrusion 146" is provided at the undercut/formed portion 140" in addition to the first protrusion 146', and the first protrusion 146' is closer to the lead end 128" than the protrusion 146' is to the lead end 128' in FIG. 9. The protrusion 146" has the same configuration as the protrusion 146'.

According to the invention, the leads 124, 124', 124" can be stabilized and will resist deformation during the process of electrically connected the leads/wires 170 to the undercut/formed regions 140, 140', 140" at the lead ends 126, 126', 126" at which there is a reduced thickness. This facilitates consistent and high integrity bonding of the leads/wires 170.

Additionally, because it is possible to bond the leads/wires 170 at reduced thickness portions of the leads 124, 124', 124" adjacent to the support 12, the lead/wire length can be shortened, reducing transmission losses. This is especially desirable in a high frequency environment.

The shortened wires also reduce wire sweep during the formation of the sealing resin 172 on the semiconductor devices 100.

Additionally, a substantial layer of the resin 172 can be received in the undercut/formed regions 140, 140', 140" to securely maintain the leads 124, 124', 124" embedded in the resin 172.

While the invention has been described with particular reference to the drawings, it should be understood that various modifications could be made without departing from the spirit and scope of the present invention.

What is claimed is:

1. A lead frame for a semiconductor device, the lead frame having opposite first and second sides bounded respectively by first and second parallel reference planes between which a thickness is defined, the lead frame comprising:

a support having a surface at the first side of the lead frame for receiving a semiconductor chip; and a plurality of leads spaced from the support to be electrically connected to a semiconductor chip on the support, a first lead in the plurality of leads having a length between first and second ends and a width taken transversely to the length, the first end of the first lead having a first region that has a thickness less than the thickness of the first lead at the second end of the first lead so that at least a part of the first region is offset from the second reference plane toward the first reference plane, the first end of the first lead having at least a first protrusion projecting away from the first reference plane.

2. The lead frame for a semiconductor device according to claim 1 wherein the first protrusion has a width less than the width of the first lead and the first end of the first lead is closer to the support than is the second lead end.

3. The lead frame for a semiconductor device according to claim 2 wherein the protrusion projects towards but not fully to the second reference plane.

4. The lead frame for a semiconductor device according to claim 2 wherein the protrusion tapers to an apex.

5. The lead frame for a semiconductor device according to claim 4 wherein the apex is substantially a point with the first lead viewed in cross section taken transversely to the length of the first lead.

6. The lead frame for a semiconductor device according to claim 2 wherein the first lead has spaced first and second edges between which the width of the first lead is defined and the protrusion is substantially centered between the first and second edges.

7. The lead frame for a semiconductor device according to claim 6 wherein the protrusion has a lengthwise extent along the length of the first lead over substantially the entire first region.

8. The lead frame for a semiconductor device according to claim 7 wherein the protrusion is centered between the first and second edges over the entire lengthwise extent of the protrusion.

9. The lead frame for a semiconductor device according to claim 2 wherein the protrusion tapers to a linear apex.

10. The lead frame for a semiconductor device according to claim 1 wherein the first lead has a second protrusion projecting away from the first reference plane at a location spaced lengthwise of the first lead from the first protrusion.

11. The lead frame for a semiconductor device according to claim 10 wherein the second protrusion has a width less than the width of the first lead.

12. The lead frame for a semiconductor device according to claim 11 wherein the second protrusion tapers to an apex.

13. The lead frame for a semiconductor device according to claim 1 wherein the region of the first lead is formed by an etching process.

14. The lead frame for a semiconductor device according to claim 1 in combination with a semiconductor chip mounted on of the support.

15. A semiconductor device comprising:
(a) a lead frame having opposite first and second sides bounded respectively by first and second substantially parallel reference planes between which a thickness is defined, the lead frame comprising:
a support having a surface at the first side of the lead frame; and
a plurality of leads spaced from the support,
a first lead in the plurality of leads having a length between first and second ends and a width taken transversely to the length,
the first end of the first lead having a first region that has a thickness less than the thickness of the first lead at the second end of the first lead so that at least a part of the first region is offset from the second reference plane toward the first reference plane,
the first end of the first lead having at least a first protrusion projecting away from the first reference plane;
(b) a semiconductor chip mounted on the support surface;
(c) a conductive element electrically connecting the semiconductor chip to the first lead; and
(d) a sealing material covering the semiconductor chip and applied to a surface of the first lead between the first and second ends of the first lead between the first and second reference planes and at the first region of the first lead so that the second end of the first lead is exposed.

16. The semiconductor device according to claim 15 wherein the first protrusion has a width less than the width of the first lead and the first end of the first lead is closer to the support than is the second lead end.

17. The semiconductor device according to claim 16 wherein the protrusion projects towards but not fully to the second reference plane.

18. The semiconductor device according to claim 16 wherein the protrusion tapers to an apex.

19. The semiconductor device according to claim 18 wherein the apex is substantially a point with the first lead viewed in cross section taken transversely to the length of the first lead.

20. The semiconductor device according to claim 16 wherein the first lead has spaced first and second edges between which the width of the first lead is defined and the protrusion is substantially centered between the first and second edges.

21. The semiconductor device according to claim 20 wherein the protrusion has a lengthwise extent over the length of the first lead over substantially the entire first region.

22. The semiconductor device according to claim 20 wherein the protrusion is centered between the first and second edges over the entire lengthwise extent of the protrusion.

23. The semiconductor device according to claim 16 wherein the protrusion tapers to a linear apex.

24. The semiconductor device according to claim 15 wherein the first lead has a second protrusion projecting away from the first reference plane at a location spaced lengthwise of the first lead from the first protrusion.

25. The semiconductor device according to claim 24 wherein the second protrusion has a width less than the width of the first lead.

26. The semiconductor device according to claim 25 wherein the second protrusion tapers to an apex.

27. The semiconductor device according to claim 15 in combination with a semiconductor chip mounted in the surface of the support.

28. The semiconductor device according to claim 15 wherein the region of the first lead is formed by an etching process.

29. The semiconductor device according to claim 15 wherein the first protrusion is fully covered by the sealing material between the first ends of the first lead.

30. The semiconductor device according to claim 15 wherein the conductive element connects closer to the first end of the first lead than to the second end of the first lead.

* * * * *